(12) United States Patent
Li et al.

(10) Patent No.: US 9,832,888 B1
(45) Date of Patent: Nov. 28, 2017

(54) CIRCUIT BOARD AND METHOD FOR MAKING THE SAME

(71) Applicants: Avary Holding (Shenzhen) Co., Limited., Shenzhen (CN); HongQiSheng Precision Electronics (QinHuangDao) Co., Ltd., Qinhuangdao (CN); GARUDA TECHNOLOGY CO., LTD., New Taipei (TW)

(72) Inventors: Yan-Lu Li, Qinhuangdao (CN); Mei Yang, Qinhuangdao (CN); Cheng-Jia Li, Qinhuangdao (CN)

(73) Assignees: Avary Holding (Shenzhen) Co., Limited, Shenzhen (CN); HongQiSheng Precision Electronics (QinHuangDao) Co., Ltd., Qinhuangdao (CN); GARUDA TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/191,554

(22) Filed: Jun. 24, 2016

(30) Foreign Application Priority Data

May 20, 2016 (CN) .......................... 2016 1 0340047

(51) Int. Cl.
*H05K 1/09* (2006.01)
*H05K 3/46* (2006.01)
(Continued)

(52) U.S. Cl.
CPC ......... *H05K 3/4644* (2013.01); *H05K 1/0298* (2013.01); *H05K 1/09* (2013.01);
(Continued)

(58) Field of Classification Search
CPC .. H05K 1/02; H05K 1/03; H05K 1/09; H05K 1/11; H05K 1/18; H05K 3/00; H05K 3/06;
(Continued)

(56) References Cited

U.S. PATENT DOCUMENTS 3,571,923 A * 3/1971 Shaheen .............. H05K 3/4647
174/266
4,258,468 A * 3/1981 Balde ................... H05K 3/0032
174/266
(Continued)

*Primary Examiner* — Xiaoliang Chen
(74) *Attorney, Agent, or Firm* — ScienBizIP, P.C.

(57) ABSTRACT

A method of manufacture of a circuit board without annular through-hole rings and thus allowing a higher component density includes a base layer, a first wire pattern layer, and a second wire pattern layer on both sides of the base layer. A portion of the base layer not covered by the first wire pattern layer defines at least one first hole. The circuit board further includes a wire layer. The wire layer includes at least a first portion and a second portion connecting to the first portion. The first portion is filled in the first hole. The second portion is formed on the first portion extending away from the base layer. A diameter of the second portion is less than an aperture diameter of the first hole. The wire layer is electrically conductive between the first wire pattern layer and the second wire pattern layer through the first portion.

7 Claims, 9 Drawing Sheets

(51) Int. Cl.
*H05K 1/02* (2006.01)
*H05K 1/11* (2006.01)
*H05K 3/02* (2006.01)
*H05K 3/00* (2006.01)
*H05K 3/40* (2006.01)

(52) U.S. Cl.
CPC .......... *H05K 1/115* (2013.01); *H05K 3/0011* (2013.01); *H05K 3/0073* (2013.01); *H05K 3/02* (2013.01); *H05K 3/4038* (2013.01); *H05K 2201/095* (2013.01)

(58) Field of Classification Search
CPC .. H05K 3/26; H05K 3/38; H05K 3/40; H05K 3/42; H05K 3/46; H01L 21/02; H01L 21/48; H01L 21/70; H01L 23/12; H01L 23/48
USPC ....... 174/257, 250, 251, 255, 258–260, 262, 174/264, 266; 29/830, 846, 852; 428/131, 209, 458, 626
See application file for complete search history.

(56) References Cited

U.S. PATENT DOCUMENTS

| | | | | |
|---|---|---|---|---|
| 5,242,540 | A * | 9/1993 | Ishii | H05K 3/06 216/106 |
| 5,243,142 | A * | 9/1993 | Ishikawa | H05K 1/113 174/258 |
| 5,444,189 | A * | 8/1995 | Nakaso | H05K 3/0055 174/255 |
| 5,638,598 | A * | 6/1997 | Nakaso | H05K 3/0055 174/262 |
| 6,005,289 | A * | 12/1999 | Watanabe | H01L 21/4857 257/700 |
| 6,200,906 | B1 * | 3/2001 | Batra | H01L 21/0274 257/E21.027 |
| 6,370,768 | B1 * | 4/2002 | Itabashi | H05K 3/422 205/126 |
| 6,440,542 | B1 * | 8/2002 | Kariya | H05K 3/0035 174/259 |
| 6,590,165 | B1 * | 7/2003 | Takada | H01L 21/486 174/260 |
| 9,640,431 | B2 * | 5/2017 | Yang | H01L 21/76873 |
| 2002/0140540 | A1 * | 10/2002 | Chen | H01C 7/02 338/22 R |
| 2002/0160165 | A1 * | 10/2002 | Matsuda | H05K 1/116 428/209 |
| 2003/0019662 | A1 * | 1/2003 | Higuchi | H05K 3/4069 174/250 |
| 2004/0086762 | A1 * | 5/2004 | Maeda | H01M 8/0228 429/465 |
| 2004/0104042 | A1 * | 6/2004 | Takase | H05K 3/462 174/255 |
| 2004/0150103 | A1 * | 8/2004 | Cooney, III | H01L 21/76802 257/734 |
| 2005/0155792 | A1 * | 7/2005 | Ito | H05K 3/4069 174/264 |
| 2006/0131729 | A1 * | 6/2006 | Lee | H01L 21/4803 257/700 |
| 2006/0145125 | A1 * | 7/2006 | Kuwajima | H01B 1/22 252/500 |
| 2007/0062908 | A1 * | 3/2007 | Yagi | H05K 3/022 216/13 |
| 2007/0095471 | A1 * | 5/2007 | Ito | H01L 23/5385 156/293 |
| 2009/0169808 | A1 * | 7/2009 | Takano | B32B 15/08 428/131 |
| 2009/0188703 | A1 * | 7/2009 | Ito | H01L 23/49838 174/255 |
| 2009/0283315 | A1 * | 11/2009 | Lee | H05K 3/421 174/262 |
| 2010/0065194 | A1 * | 3/2010 | Nagase | H05K 3/4007 156/230 |
| 2010/0288541 | A1 * | 11/2010 | Appelt | H01L 21/486 174/257 |
| 2010/0307809 | A1 * | 12/2010 | Noda | H05K 3/0032 174/266 |
| 2011/0081557 | A1 * | 4/2011 | Nagata | C23C 14/20 428/626 |
| 2013/0247373 | A1 * | 9/2013 | Fujii | H05K 3/42 29/852 |
| 2013/0256010 | A1 * | 10/2013 | Jung | H05K 3/4644 174/257 |
| 2014/0017938 | A1 * | 1/2014 | Iwano | H05K 1/114 439/586 |
| 2015/0027754 | A1 * | 1/2015 | Shimoda | B32B 27/281 174/251 |
| 2015/0126030 | A1 * | 5/2015 | Yang | H01L 21/76879 438/675 |

* cited by examiner

CIRCUIT BOARD AND METHOD FOR MAKING THE SAME

FIELD

The subject matter herein generally relates to printed circuit boards and their manufacture.

BACKGROUND

Flexible printed circuit boards generally need a highly complex, highly precise, and high-density wiring layout. However, the annular rings around conductive holes of the flexible printed circuit board reduce the utilization areas of the flexible printed circuit board and prevent high-density circuit layouts.

BRIEF DESCRIPTION OF THE DRAWINGS

Implementations of the present technology will now be described, by way of example only, with reference to the attached figures.

DETAILED DESCRIPTION

Figure 1:
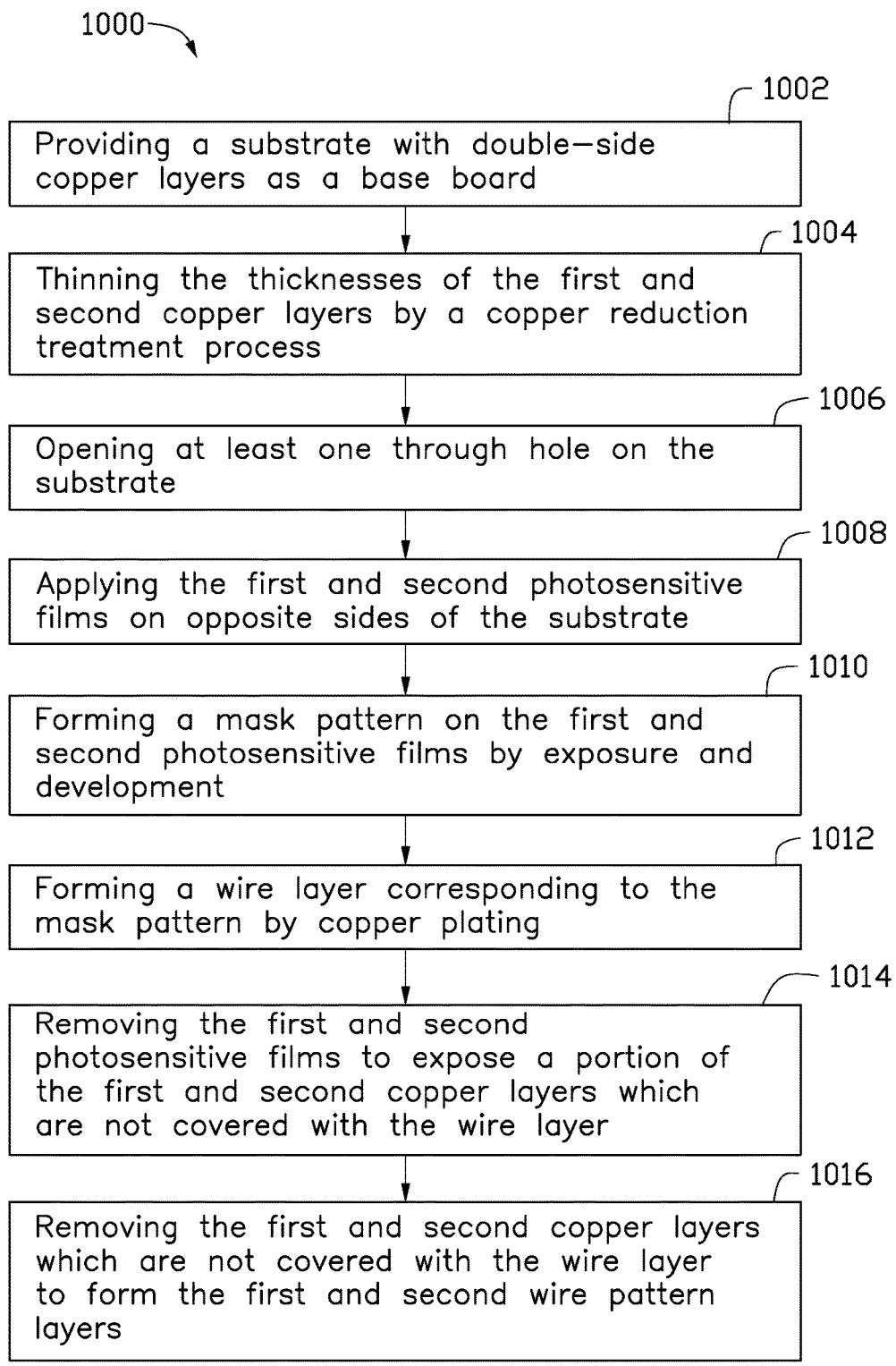
FIG. 1 shows a flowchart of a method for manufacturing a circuit board according to a first exemplary embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 shows a flowchart for a method of manufacturing a circuit board 100 in accordance with a first example embodiment. The first example method 1000 is provided by way of example, as there are a variety of ways to carry out the method. The first method 1000 described below can be carried out using the configurations illustrated in FIGS. 2 to 9, for example, and various elements of these figures are referenced in explaining the first example method 1000. Each block shown in FIG. 1 represents one or more processes, methods, or subroutines, carried out in the first example method 1000. Furthermore, the illustrated order of blocks is illustrative only and the order of the blocks can change. Additional blocks can be added or fewer blocks may be utilized, without departing from this disclosure. The first example method 1000 can begin at block 1002.

The circuit board 100 can be a high-density circuit board (HDI board), rigid-flex board, flexible printed circuit board, or IC substrate.

At block 1002, providing a substrate 10 with double-side copper layers as a base board. The substrate 10 can be a double-side board.

Figure 2:
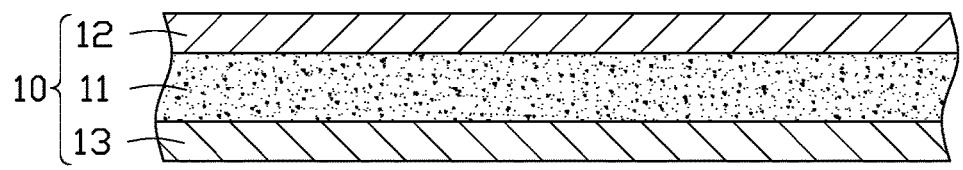
FIG. 2 shows a cross sectional view of a substrate used in the method of manufacturing a circuit board of FIG. 1.

FIG. 2 illustrates the substrate 10 with double-side copper layers. The substrate 10 includes a base layer 11, a first copper layer 12, and a second copper layer 13 which are formed on the opposite surfaces of the base layer 11.

In at least one embodiment, the base layer 11 is a flexible resin, which can be made of polyimide (PI), polyethylene terephthalate (PET), or Polyethylene Naphthalate (PEN).

At block 1004, thinning the first and second copper layers of the substrate 10 by a copper reduction treatment process.

Figure 3:
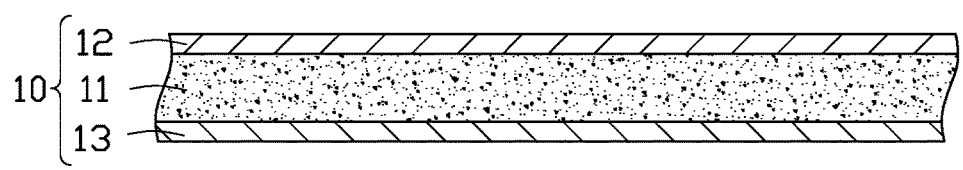
FIG. 3 shows a cross sectional view of the substrate in FIG. 2 after thinning the first and second copper layers by a copper reduction treatment process.

FIG. 3 illustrates the substrate 10 having a thinned first copper layer 12 and a thinned second copper layer 13. Specifically, the first copper layer 12 and the second copper layer 13 are etched by chemical solutions, so that the thicknesses of the first copper layer 12 and the second copper layer 13 are uniformly reduced.

At block 1006, opening at least one through hole 102 in the substrate 10.

Figure 4:
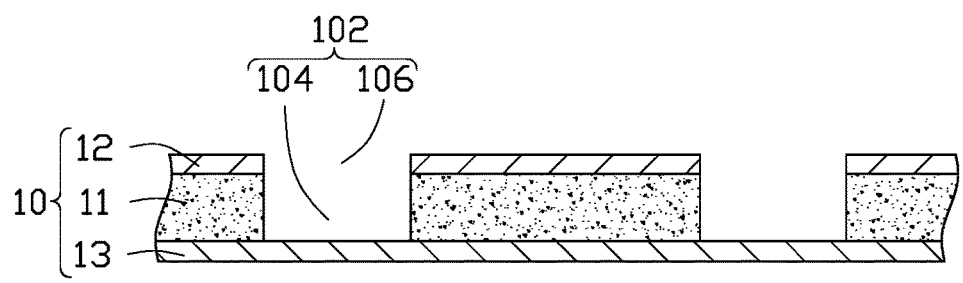
FIG. 4 shows a cross sectional view of the substrate in FIG. 3 after opening a through hole.

FIG. 4 illustrates the substrate 10 with a through hole 102. Notwithstanding the name, the through hole 102 is a blind hole which only penetrates through the first copper layer 12 and the base layer 11. In at least one embodiment, the through hole 102 is straight. The through hole 102 includes a first hole 104 and a second hole 106 communicating with the first hole 104. The first hole 104 penetrates through the base layer 11 and the second hole 106 penetrates through the first copper layer 12. In at least one embodiment, both of the first hole 104 and the second hole 106 are straight. The through hole 102 can be formed by laser processes. In at least one embodiment, the aperture diameter of the through hole 102 is equal to or greater than 50 µm. In other embodiments, an aperture diameter of the through hole 102 can be according to specific needs At block 1008, applying a first photosensitive film and a second photosensitive film on opposite surfaces of the substrate 10 with the through hole 102.

Figure 5:
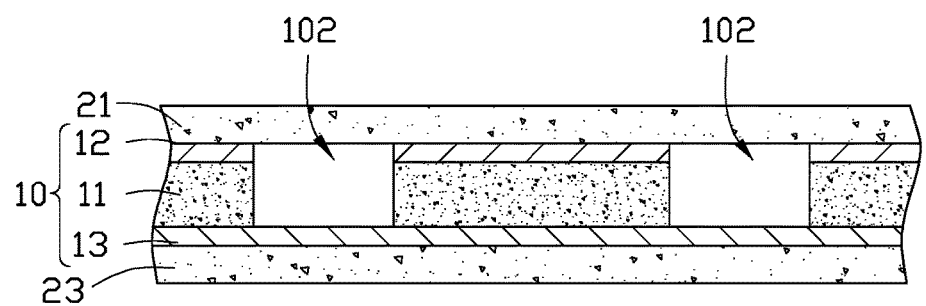
FIG. 5 shows a cross sectional view of the substrate in FIG. 4 after applying a first photosensitive film and a second photosensitive film on opposite surfaces of the substrate.

FIG. 5 illustrates a first photosensitive film 21 and a second photo sensitive film 23 applied to opposite surfaces of the substrate 10 with the through hole 102. The first photosensitive film 21 covers the first copper layer 12 and the open end of the through hole 102. The second photosensitive film 23 covers the second copper layer 13.

A block 1010, forming a mask pattern 210 on the first and second photosensitive films 21 and 23 by exposure and development.

Figure 6:
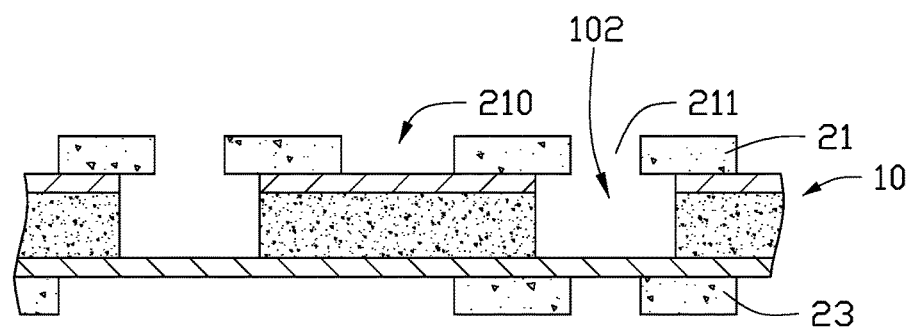
FIG. 6 shows a cross sectional view of the substrate in FIG. 5 after forming a mask pattern on the first and second photosensitive films by exposure and development.

FIG. 6 illustrates a mask pattern 210 formed on the first photosensitive film 21 and the second photosensitive film 23 after exposing and developing the first photosensitive film 21 and the second photosensitive film 23. The mask pattern 210 includes an opening 211 which corresponds to the open end of the through hole 102.

In at least one embodiment, the mask pattern 210 is also formed on the second photosensitive film 23 and the first photosensitive film 21 except for the opening 211.

In at least one embodiment, a central axial line of the opening 211 coincides with a central axial line of the through hole 102. The aperture diameter of the opening 211 is equal to one half of or more than one half of the aperture diameter of the through hole 102, but less than the aperture diameter of the through hole 102.

A block 1012, forming a wire layer 31 corresponding to the mask pattern 210, by copper plating.

Figure 7:
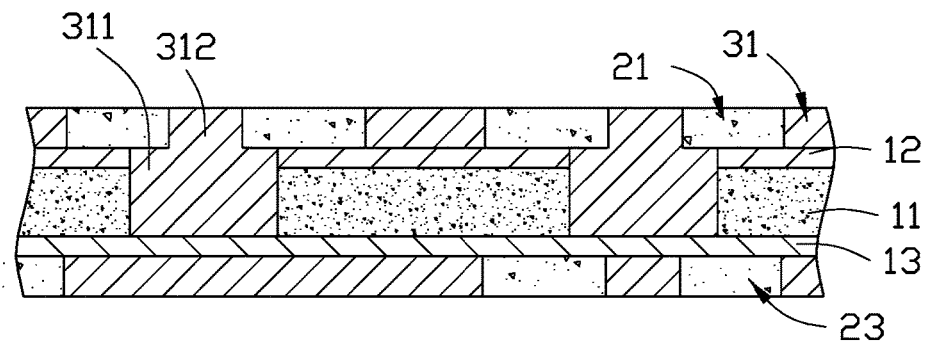
FIG. 7 shows a cross sectional view of the substrate in FIG. 6 after forming a wire layer by copper plating.

FIG. 7 illustrates a wire layer 31 corresponding to the mask pattern 210 formed by copper plating. The wire layer 31 includes at least a first portion 311 filled with the plated copper in the through hole 102, and a second portion 312 filled with plated copper in the opening 211. The second portion 312 connects to the first portion 311. In at least one embodiment, the wire layer 31 is also formed on a surface of the first copper layer 12 facing away from the base layer 11 and a surface of the second copper layer 13 facing away from the base layer 11. The wire layer 31 is electrically conductive between the first copper layer 12 and the second copper layer 13 through the first portion 311.

A block 1014, removing the first and second photosensitive films to expose a portion of the first and second copper layers which are not covered with the wire layer 31.

Figure 8:
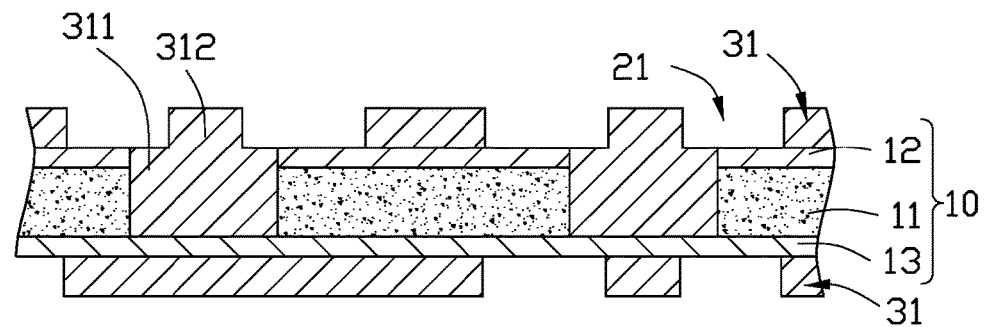
FIG. 8 shows a cross sectional view of the substrate in FIG. 7 after removing the first and second photosensitive films.

FIG. 8 illustrates that the first photosensitive film 21 and the second photosensitive film 23 are removed to expose the wire layer 31 and a portion of the first copper layer 12 and the second copper layer 13 which are not covered with the wire layer 31.

At block 1016, removing the first and second copper layers which are not covered with the wire layer 31 so as to respectively form a first wire pattern layer 120 and a second wire pattern layer 130.

Figure 9:
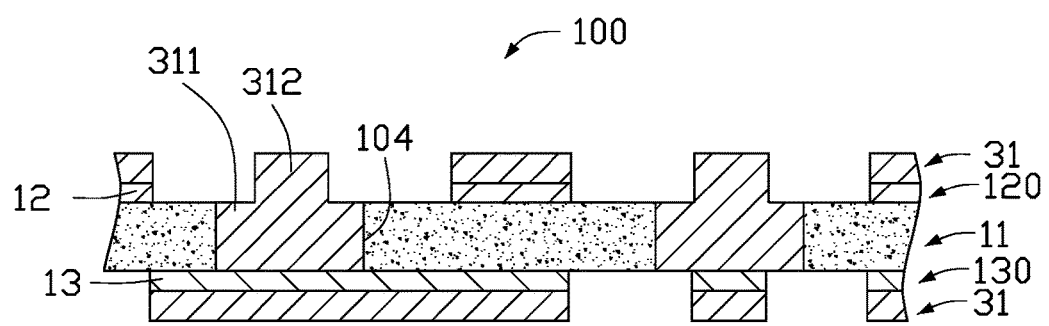
FIG. 9 shows a cross sectional view of the substrate in FIG. 8 after removing the first and second copper layers which are not covered with the wire layer to form the first and second wire pattern layers by using a quick etching treatment.

FIG. 9 illustrates the first copper layer 12 and the second copper layer 13 which are not covered with the wire layer 31 being removed by using a quick etching treatment. A portion of the first portion 311 which is flush with the first copper layer 12 and not covered by the second portion 312 is also removed by using the quick etching treatment. Thereby, the first copper layer 12 and the second copper layer 13 after the quick etching treatment are respectively formed as a first wire pattern layer 120 and a second wire pattern layer 130 corresponding to the wire layer 31. In addition, the first portion 311 is flush with the base layer 11 to obtain the circuit board 100 after the quick etching treatment. In at least one embodiment, the quick etching treatment is an anisotropic etching process which has an etching rate in the vertical direction much higher than an etching rate in the horizontal direction. The vertical direction is substantially normal to the base layer 11.

The method of manufacturing the circuit board 100 can omit the copper reduction treatment process in block 1004 according to specific needs.

Referring to FIG. 9, the circuit board 100 made by the example method 1000 described in the above embodiments includes a base layer 11, a first wire pattern layer 120, and a second wire pattern layer 130. The first wire pattern layer 120 and the second wire pattern layer 130 are formed on opposite surfaces of the base layer 11. A portion of the base layer 11 which is not covered by the first wire pattern layer 120 defines at least one first hole 104. The circuit board 100 further includes a wire layer 31. The wire layer 31 includes at least a first portion 311 and a second portion 312 connecting to the first portion. The first portion 311 is filled in the first hole 104. The second portion 312 is formed on the first portion 311 extending in a direction facing away from the base layer 11. A diameter of the second portion 312 is equal to one half of or greater than one half of a diameter of the first portion 311, the diameter of the second portion 312 being less than an aperture diameter of the first hole 104. The wire layer 31 is electrically conductive between the first wire pattern layer 120 and the second wire pattern layer 130 through the first portion 311.

Figure 10:
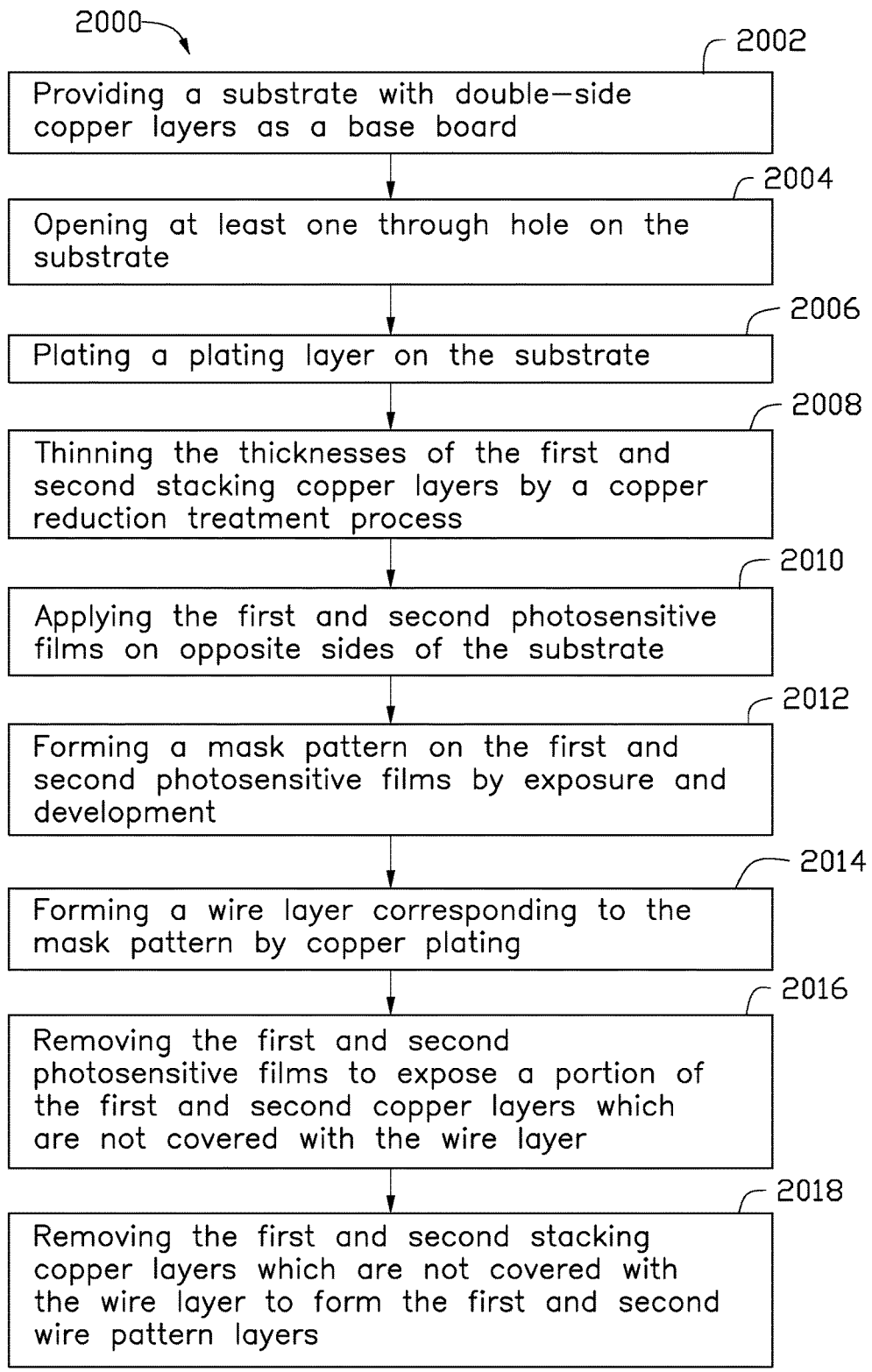
FIG. 10 shows a flowchart of a method for manufacturing a circuit board according to a second exemplary embodiment

FIG. 10 shows a flowchart for a method of manufacturing a circuit board 100 in accordance with a second example embodiment. The second example method 2000 is provided by way of example, as there are a variety of ways to carry out the method. The second method 2000 described below can be carried out using the configurations illustrated in FIGS. 2 and 4 and 11 to 17, for example, and various elements of these figures are referenced in explaining the second example method 2000. Each block shown in FIG. 10 represents one or more processes, methods, or subroutines, carried out in the second example method 2000. Furthermore, the illustrated order of blocks is illustrative only and the order of the blocks can change. Additional blocks can be added or fewer blocks may be utilized, without departing from this disclosure. The second example method 2000 can begin at block 2002.

The circuit board 100 can be a high-density circuit board (HDI board), rigid-flex board, flexible printed circuit board, or IC substrate.

At block 2002, providing a substrate 10 with double-side copper layers as a base board. The substrate 10 can be a double-side board.

FIG. 2 illustrates the substrate 10 with double-side copper layers. The substrate 10 includes a base layer 11, a first copper layer 12, and a second copper layer 13 formed on opposite surfaces of the base layer 11.

In at least one embodiment, the base layer 11 is a flexible resin, made of polyimide (PI), polyethylene terephthalate (PET), or Polyethylene Naphthalate (PEN).

At block 2004, opening at least one through hole 102 on the substrate 10.

FIG. 4 illustrates the substrate 10 with a through hole 102. The through hole 102 is a blind hole which penetrates through the first copper layer 12 and the base layer 11. The through hole 102 includes a first hole 104 and a second hole 106 communicating with the first hole 104. The first hole 104 penetrates through the base layer 11 and the second hole 106 penetrates through the first copper layer 12. The through hole 102 can be formed by laser processes. In at least one embodiment, the aperture diameter of the through hole 102 is equal to or greater than 50 μm. In other embodiments, the aperture diameter of the through hole 102 can be set according to specific needs At block 2006, applying a plating layer 30 on the substrate 10.

Figure 11:
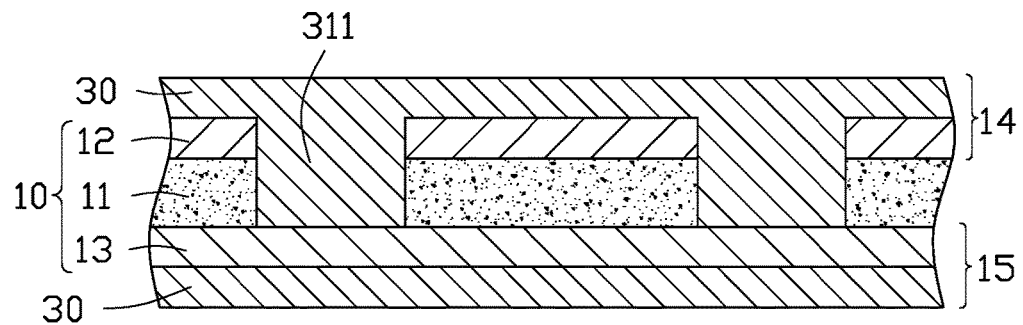
FIG. 11 shows a cross sectional view of the substrate in FIG. 4 after applying a plating layer to form the first and second stacking copper layers according to a second exemplary embodiment.

FIG. 11 illustrates that a plating layer 30 is formed on the substrate 10 by plating the substrate 10. The plating layer 30 includes at least a first portion 311 filled in the through hole 102. In at least one embodiment, the plating layer 30 further covers the first copper layer 12 and the second copper layer 13. The plating layer 30 combines with the first copper layer 12 to constitute a first stacking copper layer 14. In addition, the plating layer 30 combines with the second copper layer 13 to constitute a second stacking copper layer 15.

At block 2008, thinning the thicknesses of the first stacking copper layer 14 and the second stacking copper layer 15 by a copper reduction treatment process.

Figure 12:
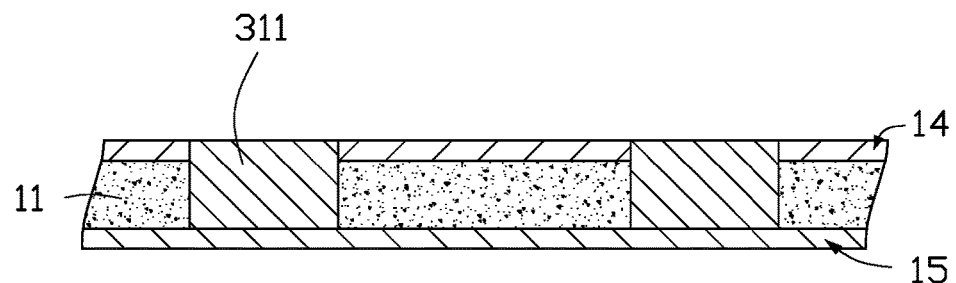
FIG. 12 shows a cross sectional view of the substrate in FIG. 11 after thinning the thicknesses of the first and second stacking copper layers by using a copper reduction treatment process.

FIG. 12 illustrates that the thicknesses of the first stacking copper layer 14 and the second stacking copper layer 15 are both uniformly reduced after the copper reduction treatment process.

At block 2010, applying a first photosensitive film and a second photosensitive film on opposite surfaces of the substrate 10 with a plating layer 30.

Figure 13:
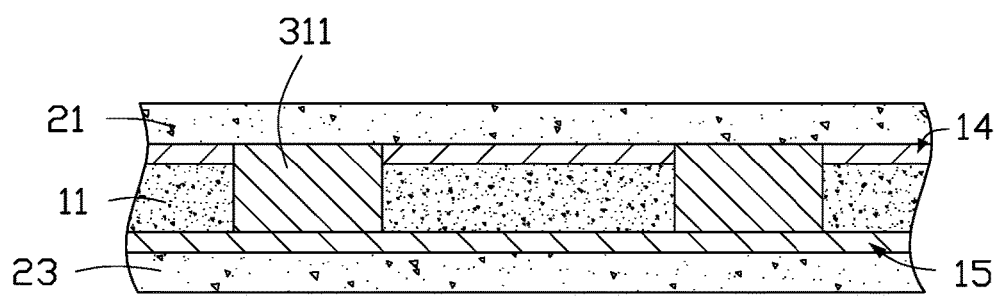
FIG. 13 shows a cross sectional view of the substrate in FIG. 12 after applying the first and second photosensitive films on the first and second stacking copper layers.

FIG. 13 illustrates that a first photosensitive film 21 and a second photo sensitive film 23 are applied on opposite surfaces of the substrate 10 so as to cover at least the plating layer 30.

At block 2012, forming a mask pattern 210 on the first and second photosensitive films by exposure and development.

Figure 14:
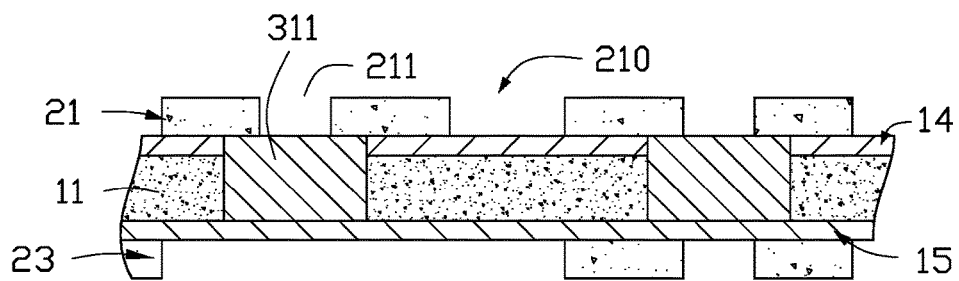
FIG. 14 shows a cross sectional view of the substrate in FIG. 13 after forming a mask pattern on the first and second photosensitive films by exposure and development.

FIG. 14 illustrates that a mask pattern 210 is formed on the first photosensitive film 21 and the second photosensitive film 23 after exposing and developing the first photosensitive film 21 and the second photosensitive film 23. The mask pattern 210 includes at least an opening 211 corresponding to the through hole 102.

In at least one embodiment, a central axial line of the opening 211 coincides with a central axial line of the through hole 102. The aperture diameter of the opening 211 is equal to one half of or greater than one half of the aperture diameter of the through hole 102, but less than the aperture diameter of the through hole 102.

In at least one embodiment, the mask pattern 210 is also formed on the second photosensitive film 23 and the first photosensitive film 21 except for the opening 211.

At block 2014, forming a wire layer 31 corresponding to the mask pattern 210 by copper plating.

Figure 15:
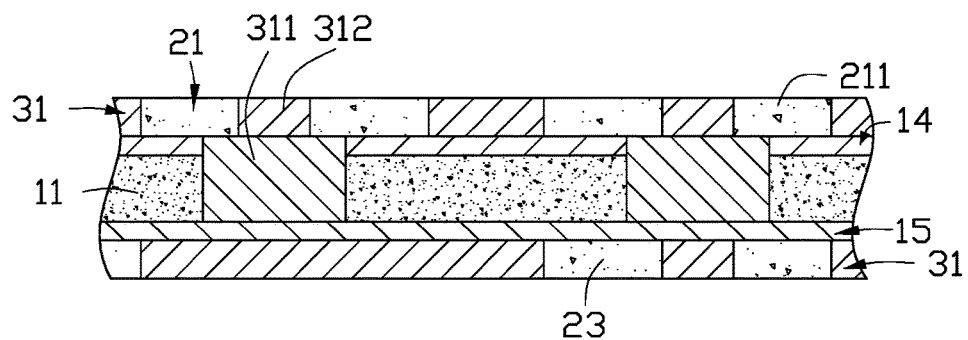
FIG. 15 shows a cross sectional view of the substrate in FIG. 14 after forming a wire layer by copper plating.

FIG. 15 illustrates a wire layer 31 corresponding to the mask pattern 210 formed by copper plating. The wire layer 31 includes at least a first portion 311 filled with the plated copper in the through hole 102, and a second portion 312 filled with plated copper in the opening 211. The second portion 312 connects to the first portion 311. In at least one embodiment, the wire layer 31 is further formed on a surface of the first copper layer 12 facing away from the base layer 11 and a surface of the second copper layer 13 facing away from the base layer 11. The wire layer 31 is electrically conductive between the first copper layer 12 and the second copper layer 13 through the first portion 311.

At block 2016, removing the first and second photosensitive films to expose a portion of the first and second copper layers 12 and 13 which are not covered with the wire layer 31.

Figure 16:
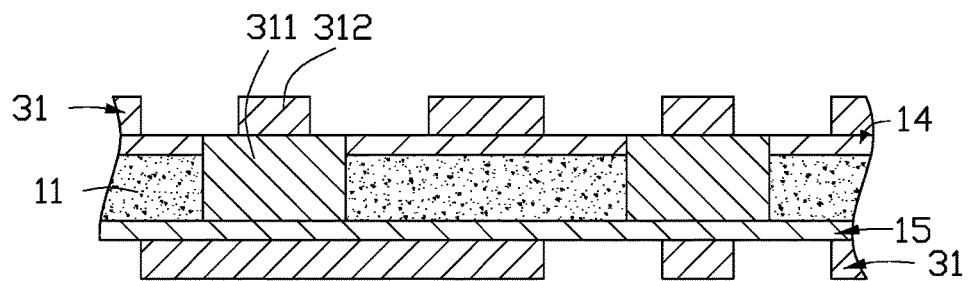
FIG. 16 shows a cross sectional view of the substrate in FIG. 15 after removing the first and second photosensitive films.

FIG. 16 illustrates the first photosensitive film 21 and the second photosensitive film 23 removed so as to expose the wire layer 31, and also to expose a portion of the first copper layer 12 and the second copper layer 13 which are not covered with the wire layer 31.

At block 2018, removing the first stacking copper layer 14 and the second stacking copper layer 15 which are not covered with the wire layer 31 so as to form a first wire pattern layer 120 and a second wire pattern layer 130.

Figure 17:
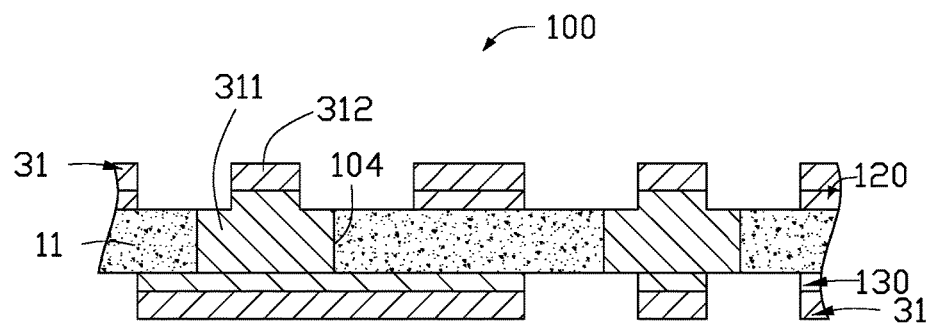
FIG. 17 shows a cross sectional view of the substrate in FIG. 16 after removing the first and second stacking copper layers which are not covered with the wire layer, by using a quick etching treatment.

FIG. 17 illustrates that the parts of the first stacking copper layer 14 and the second stacking copper layer 15 which are not covered with the wire layer 31 are removed using a quick etching treatment. After the quick etching treatment, the first stacking copper layer 14 and the second stacking copper layer 15 corresponding to the wire layer 31 respectively become a first wire pattern layer 120 and a second wire pattern layer 130. In addition, a portion of the first portion 311 is flush with the base layer 11 so as to obtain the circuit board 100. In at least one embodiment, the quick etching treatment is an anisotropic etching process with an etching rate in the vertical direction much higher than an etching rate in the horizontal direction. The vertical direction is substantially normal to the base layer 11.

The method of manufacturing the circuit board 100 in the second embodiment can omit the copper reduction treatment process according to specific needs.

Figure 18:
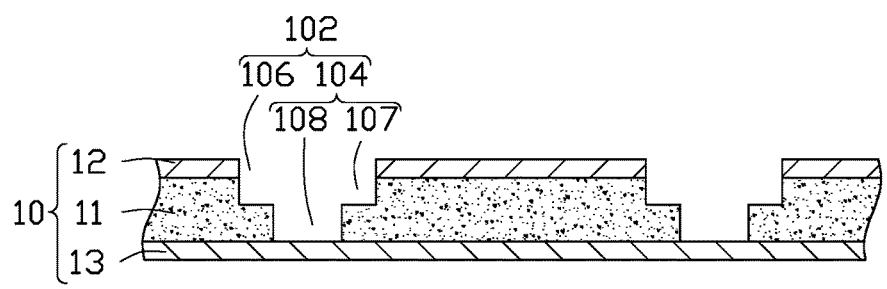
FIG. 18 shows a cross sectional view of a substrate after opening a stepped hole according to a third and fourth exemplary embodiments.
Figure 19:
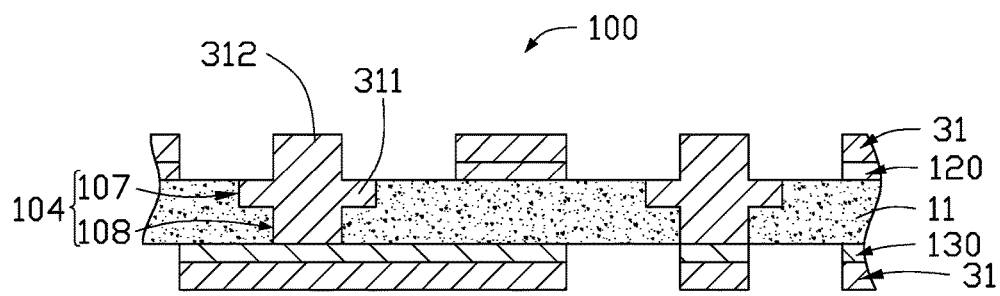
FIG. 19 shows a cross sectional view of a circuit board according to the third exemplary embodiment.

FIG. 18 and FIG. 19 show a method of manufacturing a circuit board 100 in a third exemplary embodiment. The difference between the first and third embodiments is that the first hole 104 at block 1006 is a stepped hole. The first hole 104 includes a wide portion 107 and a narrow portion 108 in the third exemplary embodiment. The wide portion 107 communicates with the second hole 106 and constitutes a straight hole together with the second hole 106. The narrow portion 108 communicates with the wide portion 107, and the aperture diameter of the narrow portion 108 is smaller than the aperture diameter of the wide portion 107. The wide portion 107 is adjacent to a surface of the base layer 11 with the first copper layer 12. The narrow portion 108 is adjacent to a surface of the base layer 11 with the second copper layer 13.

In at least one embodiment, a depth of the wide portion 107 is equal to one half or less of the thickness of the base layer 11.

Figure 20:
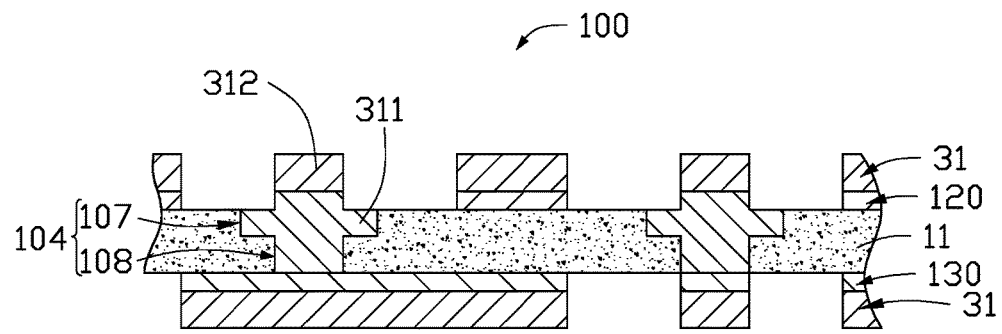
FIG. 20 shows a cross sectional view of a circuit board according to the fourth exemplary embodiment.

FIG. 18 and FIG. 20 show a method of manufacturing a circuit board 100 in a fourth exemplary embodiment. The difference between the second and fourth embodiments is that the first hole 104 at block 2004 is a stepped hole. The first hole 104 includes a wide portion 107 and a narrow portion 108 in the fourth exemplary embodiment. The wide portion 107 communicates with the second hole 106 and constitutes a straight hole together with the second hole 106. The narrow portion 108 communicates with the wide portion 107, and the aperture diameter of the narrow portion 108 is smaller than the aperture diameter of the wide portion 107.

Figure 21:
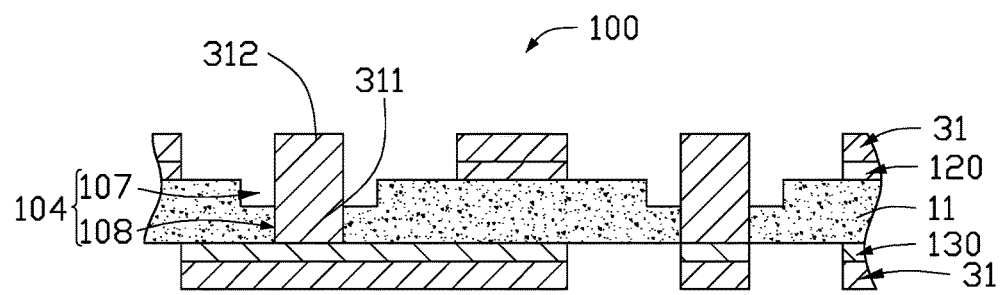
FIG. 21 shows a cross sectional view of a circuit board according to a fifth exemplary embodiment.

FIG. 21 shows a method of manufacturing a circuit board 100 in a fifth exemplary embodiment. The difference between the third and fifth embodiments is that the first portion 311 filled in the wide portion 107 and not covered by the second portion 312 is etched by using the quick etching treatment described at block 1016.

Figure 22:
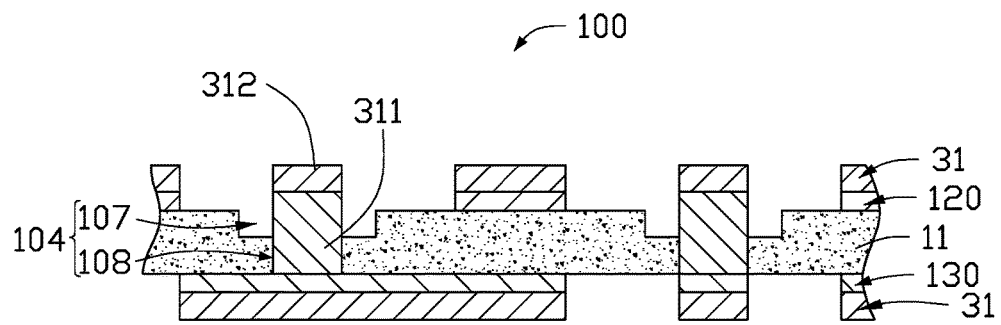
FIG. 22 shows a cross sectional view of a circuit board according to a sixth exemplary embodiment.

FIG. 22 shows a method of manufacturing a circuit board 100 in a sixth exemplary embodiment. The difference between the fourth and sixth embodiments is that the first portion 311 filled in the wide portion 107 and not covered by the second portion 312 is etched by using the quick etching treatment described at block 2018.

In these methods of manufacturing a flexible circuit board 100, filling and plating techniques are used to create electrical conductivity between the first wire pattern layer 120 and the second wire pattern layer 130, by infilling the first portion 311 and the second portion 312 in the through hole 102. In addition, the opening 211 corresponding to the through hole 102 has an aperture diameter which is less than the aperture diameter of the through hole 102 after exposing and developing processes, so that the diameter of the second portion 312 is less than the aperture diameter of the first hole 104 after copper plating. This avoids an annular ring occupying the usage area of the flexible circuit board and increases the layout density of the flexible circuit board. A high-density fine line production can be achieved when the second portion 312 and the first portion 311 are electrically conductive. The first holes 104 being stepped holes and the aperture diameter of the wide portion 107 being greater than the aperture diameter of the narrow portion 108 allows the wide portion 107 to have positional tolerance to shift within the exposing and developing processes. Therefore, a loss rate due to position shifting within the exposing and developing processes is reduced and a yield rate of manufacturing the flexible circuit board is increased.

The embodiments shown and described above are only examples. Many details are often found in the art such as the other features of manufacturing a circuit board. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method of manufacturing a circuit board, comprising:
   providing a substrate with double-side copper layers, wherein the substrate comprises a base layer, a first copper layer and a second copper layer, the first copper layer and the second copper layer are formed on opposite surfaces of the base layer;
   opening a through hole on the substrate, wherein the through hole comprises a first hole and a second hole communicating with the first hole, the first hole penetrates through the base layer and the second hole penetrates through the first copper layer;
   forming a wire layer by copper plating, wherein the wire layer comprises a first portion filled in the through hole and a second portion formed on the first portion extending in a direction facing away from the base layer, the wire layer is electrically conductive between the first copper layer and the second copper layer through the first portion; wherein the manufacturing method of forming the wire layer is further comprising the steps of:
   applying a first photosensitive film and a second photosensitive film on the opposite surfaces of the substrate, the first photosensitive film covers the first copper layer and the open end of the through hole, the second photosensitive film covers the second copper layer;
   forming a mask pattern on the first and second photosensitive films after exposing and developing the first and second photosensitive films, the mask pattern comprises an opening which corresponds to the open end of the through hole, the aperture diameter of the opening is less than the aperture diameter of the through hole;
   forming a wire layer corresponding to the mask pattern by copper plating, the second portion is filled in the opening; and
   removing the first and second photosensitive films; and
   removing the first copper layer and the second copper layer which are not covered with the wire layer by using a quick etching treatment so as to respectively form a first wire pattern layer and a second wire pattern layer, and the first portion which is flush with the first copper layer and not cover with the second portion.

2. The method of manufacturing the circuit board of claim 1, wherein the through hole is a straight hole.

3. The method of manufacturing the circuit board of claim 1, wherein the first hole is a stepped hole, the first hole comprises a wide portion and a narrow portion communicating with the wide portion, the narrow portion is adjacent to a surface of the base layer with the second copper layer.

4. The method of manufacturing the circuit board of claim 3, wherein a depth of the wide portion is equal to one half or less of the thickness of the base layer.

5. The method of manufacturing the circuit board of claim 1, wherein the step of removing the first and second copper layers which are not covered with the wire layer is further to remove the first portion filled in the wide portion and not covered with the second portion.

6. The method of manufacturing the circuit board of claim 1, wherein the wire layer is formed on a surface of the first wire pattern layer facing away from the base layer and a surface of the second wire pattern layer facing away from the base layer.

7. The method of manufacturing a circuit board of claim 1, wherein the method further comprises a copper reduction treatment process prior to open the through hole, so that the thicknesses of the first copper layer and the second copper layer are uniformly reduced.

* * * * *